United States Patent [19]

Arthur et al.

[11] Patent Number: 5,077,115
[45] Date of Patent: Dec. 31, 1991

[54] THERMOPLASTIC COMPOSITE MATERIAL

[75] Inventors: David J. Arthur, Norwood, Mass.; Allen F. Horn, III, Danielson, Conn.; Kenneth W. Kristal, Worcester; Gwo S. Swei, Northboro, both of Mass.; William R. Zdanis, Danielson, Conn.

[73] Assignee: Rogers Corporation, Rogers, Conn.

[21] Appl. No.: 521,982

[22] Filed: May 8, 1990

[51] Int. Cl.$^5$ .................................................. B32B 9/00
[52] U.S. Cl. .................................... 428/137; 428/195; 428/209; 428/323; 428/327; 428/328; 428/357; 428/403; 428/446; 428/901; 361/397
[58] Field of Search ............... 428/137, 195, 209, 323, 428/327, 328, 357, 446, 901, 403; 361/397

[56] References Cited

FOREIGN PATENT DOCUMENTS 943387 3/1974 Canada .
0066330 12/1982 European Pat. Off. .

Primary Examiner—Patrick J. Ryan
Attorney, Agent, or Firm—Fishman, Dionne & Cantor

[57] ABSTRACT

A thermoplastic composite material is presented which comprises a thermoplastic matrix which is highly filled with a coated ceramic filler. In an important feature of the present invention, the ceramic filler has been coated with a rubbery polymer that bonds to the filler. In a preferred embodiment, the thermoplastic matrix comprises a fluoropolymer, preferably a chlorofluoropolymer and the ceramic filler is a fused amorphous silica coated with a rubbery polymeric material. The thermoplastic composite material of this invention exhibits numerous advantages which makes it well suited for use as a bonding film, particularly a bonding film for producing multilayer printed wiring boards.

27 Claims, 1 Drawing Sheet

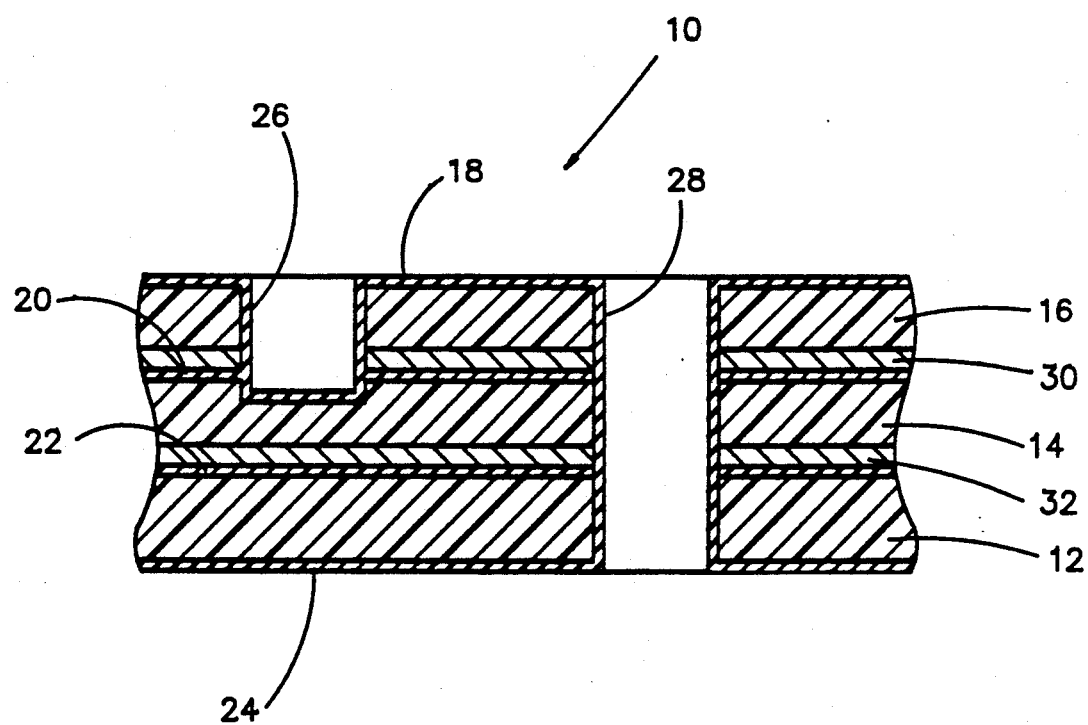

THERMOPLASTIC COMPOSITE MATERIAL

BACKGROUND OF THE INVENTION

This invention relates to a thermoplastic composite material. More particularly, this invention relates to a thermoplastic composite material which is particularly well suited for use as a bonding ply in a multilayer circuit board.

U.S. Pat. No. 4,849,284 which is assigned to the assignee hereof and incorporated herein by reference describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability.

The ceramic filled fluoropolymer-based electrical substrate material of U.S. Ser. No. 015,191 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated through-hole reliability. As is known, individual sheets of this electrical substrate material may be stacked to form a multilayer circuit board. In fact, thin film formulations of the material disclosed in U.S. Pat. No. 4,849,284 (and sold by Rogers Corporation under the trademark RO-2810) may be used as a bonding ply to bond together the plurality of stacked substrate layers so as to form the multilayer circuit board.

While well suited for its intended purposes, it has now been determined that the fluoropolymeric composite material of U.S. Pat. No. 4,849,284 has certain drawbacks when used as a bonding ply to form a multilayer circuit board. For example, high temperature, high pressure lamination equipment is required for using RO-2810 bonding plys to laminate inner layers of RO-2800. This is a drawback as standard epoxy-glass lamination equipment operates at temperatures of less than 500° F. and pressures of less than 300 psi. Thus, such standard and readily available equipment cannot be used to bond RO-2810 bonding plys thereby necessitating the purchase of more expensive equipment. Accordingly, there is a need for a thin sheet bonding material that can be used to laminate RO-2800 inner layers into multilayer structures at temperatures of less than 500° F. and pressures of less than 300 psi so that standard epoxy-glass lamination equipment can be used. Of course, this material should possess all of the required properties of a circuit board substrate (chemical processing, temperature resistance, adhesion, etc.) and as many of the excellent electrical, mechanical and thermal properties (low Dk, low loss, low z-axis CTE) of RO-2800 as is possible.

SUMMARY OF THE INVENTION

The above-discussed and other drawbacks of the prior art are overcome or alleviated by the thermoplastic composite material of the present invention. In accordance with the present invention, an improved thermoplastic composite material comprises a thermoplastic matrix which is highly filled with a coated ceramic filler.

In an important feature of the present invention, the ceramic filler has been coated with a rubbery polymer that bonds to the filler. In a preferred embodiment, the thermoplastic matrix comprises a fluoropolymer, preferably a chlorofluoropolymer and the ceramic filler is a fused amorphous silica coated with a rubbery or elastomeric polymeric material, preferably silicone rubber.

The thermoplastic composite material of this invention exhibits numerous advantages which makes it well suited for use as a bonding film, particularly a bonding film for fluoropolymer composite circuit substrates such as RO-2800. For example, the material of this invention bonds at temperatures of less than 500° F. and at pressures of less than 300 psi so that standard epoxy-board lamination equipment can be used to produce RO-2800 or like multilayer printed wiring boards (PWB). The material of the present invention also has a dielectric constant of approximately 3, a tan delta of about 0.004, a z-axis CTE of less than 75 ppm/°C., adheres well to copper and RO-2800, and is resistant to solvents and vapors used in manufacturing PWB's. In addition, multilayer PWB's bonded with the material of this invention will exhibit drilling properties superior to those of woven glass reinforced materials due to the particulate filler. Still another feature of this invention is the high degree of compliancy exhibited by the composite when compared to the compliancy of the materials described in U.S. Pat. No. 4,849,284.

The above-discussed and other features and advantages of the present invention will be appreciated and understood by those of ordinary skill in the art from the following detailed description and drawings.

BRIEF DESCRIPTION OF THE DRAWING

The single drawing FIGURE is a cross-sectional elevation view of a multilayer circuit board employing the thermoplastic composite material in accordance with the present invention as a thin film bonding ply.

DESCRIPTION OF THE PREFERRED EMBODIMENT

The thermoplastic composite material of the present invention generally comprises a polymer matrix filled with a ceramic filler which has been coated with a rubbery polymer which bonds to the ceramic filler. The rubbery polymer typically does not bond to the polymer matrix. However, the rubbery polymer may alternatively bond to the surrounding matrix.

The polymer binder or matrix comprises an extrudable thermoplastic so that the product can be made with conventional sheet extrusion equipment. In a preferred embodiment, the polymer matrix comprises an extrudable fluoropolymer, preferably a chlorofluoropolymer such as poly(ethylene-co-chlorotrifluoroethylene) known as ECTFE or chlorotrifluoroethylene. However, it will be appreciated that many other extrudable polymers may be utilized for the matrix of this invention so long as the thermal properties thereof permit lamination at temperatures of less than 500° F. and pressures of less than 300 psi. Examples of other suitable polymers include poly(4-methylpentene), polychlorotrifluoroethylene and polyolefins such as polyethylene.

The ceramic filler is preferably silica and more preferably fused amorphous silica. The polymer matrix is filled with greater than 40 volume % fused silica or other ceramic filler to lower the CTE to the desired target of less than 75 ppm/°C. Fused amorphous silica is the preferred ceramic filler due to its extremely low CTE (0.6 ppm/°C. over a wide range of temperature) and relatively low dielectric constant and loss, but any of a number of ceramic materials (such as microcrystalline silica and glass spheres) would yield a useful product similar to the present invention.

A novel and important feature of the present invention is that the ceramic filled composite is made more flexible by the use of ceramic filler coated with approximately 2 to 10% by weight or 2 to 20% by volume (of the total ceramic filler) by any of a number of elastomeric or rubbery polymeric materials that are bonded to the surface of the filler. The rubbery coated filler may or may not bond to the binder resin matrix. The use of such treated fillers in the present invention increase the ultimate tensile elongation of the composite to a degree that makes it handleable in sheet form.

Examples of rubbery polymeric materials suitable for use in the present invention include, but are not limited to silicone rubbers. Of course, all of these rubbery polymeric materials must form a chemical bond with the ceramic substrate, but not necessarily form a chemical bond to the surrounding thermoplastic matrix. The fact that the highly ceramic filled composite of the present invention is relatively flexible is both surprising and unexpected as normally, a thermoplastic material below its $T_g$ or melting point would be so brittle as to be unhandlable with greater than 40 volume % particulate filler. (See A. S. Kenyon & H. J. Duffy, "Properties of a Particulate-Filled Polymer," Polym. Eng. & Sci., July 1967, p. 189).

U.S. application Ser. No. 07/519,943 filed on May 7, 1990 invented by Gwo Swei and entitled "Coated Filler Particles and Method for Making Same" is assigned to the assignee hereof and fully incorporated herein by reference. This prior application describes in great detail a method for coating ceramic particles with a rubbery coating and more particularly, a reactive silicone. Reference should be made to this prior application for a detailed description of the referred rubbery coatings and methods of making same.

It has been discovered that when the thermoplastic matrix comprises a chlorofluoropolymer or other fluoropolymer, the degradation of the matrix is accelerated or catalyzed by the presence of siliceous ceramic fillers. In accordance with the present invention, the rate of this filler induced degradation is substantially reduced by the addition of an "acid scavenger". The acid scavengers found to be effective in the present invention are any of a number of metal oxides, such as CaO, ZnO, MgO or $Sb_2O_3$. Due to the low water absorption of the resulting composite materials, those made using $Sb_2O_3$ have been preferred. The use of such acid scavengers to stabilize these composites during extrusion represents a novel and important feature of this invention.

As mentioned, the thermoplastic composite of the present invention finds particular utility when used as a thin layer bonding ply in a multilayer circuit board. Turning now to the FIGURE, such a multilayer circuit board is shown generally at 10. Multilayer board 10 comprises a plurality of layers of substrate material 12, 14 and 16, all of which are comprised of an electrical substrate material, preferably the ceramic filled fluoropolymeric material of U.S. Pat. No. 4,849,284 sold under the RO-2800 trademark. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention are used as an adhesive or bond ply to laminate individual circuit substrates together. In a preferred method of forming such a laminate, a stack-up of circuit substrates altered with one or more layers of the bond ply is made. This stack-up is then fusion bonded at a temperature of less than 500° F. and a pressure of less than 300 psi whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane coated ceramic filled fluoropolymer of U.S. Pat. No. 4,849,284. Although, in a preferred embodiment, a multilayer circuit board includes circuit substrates which are all comprised of the electrical substrate material of U.S. Pat. No. 4,849,284.

Alternatively, the electrical substrates 12, 14 or 16 may be comprised of the composite material of the present invention. In this latter application, the composite of this invention may also be used as a single layer printed wiring board substrate having conductive traces (e.g. copper, aluminum thereon.

The present invention will be more fully understood from the following non-limiting EXAMPLES.

In all of the examples of "soft rubber coated filler" cited below, the ceramic filler has been coated with poly(dimethylsiloxane) (commonly called "silicone rubber") that was "functionalized" with tri-alkyloxy silane end groups. These end groups react with the surface of the ceramic filler and chemically bond the silicone rubber to the surface. Solvent extraction of the coated filler with hexane demonstrates that the majority of the rubber was indeed chemically bound to the filler.

Example I Filled Polyolefin

The below examples demonstrate the improvement in ultimate elongation of a filled polyolefin when the rubber coated filler is used in contrast to untreated or conventionally silane-treated filler (such as if found in the material of U.S. Pat. No. 4,849,284).

The following samples were prepared using "Hostalen GK9050," a medium molecular weight High Density Polyethylene manufactured by Hoechst. The composites were prepared using Brabender ® Plasticorder with the heating oil temperature set for 170° C. The initial temperature of the mixing head was 160° C. The mixing speed for all samples was 40 rpm. The weighed sample of speed for all samples was 40 rpm. The weighted sample of polyethylene resin was placed in the mixing head with the blades rotating. After the resin melted completely in 2 minutes, the filler was added over a period of 90 to 120 seconds. The filler and resin were blended for an additional 6 to 7 minutes. The resulting composite material was removed from the blender and pressed in a hot (160° C.) platen hydraulic press between release sheets to an approximate thickness of 0.060". Tensile bar specimens were cut from the sheet and the elongation at failure of the materials was determined.

This experiment was conducted with the fused amorphous silica as the ceramic filler. The coatings in Table 1 were investigated. Filler 1 is "as received" from the silica manufacturer with no surface treatment. Fillers 2 and 3 are treated with conventional silane treatments. Fillers 4 through 7 have an increasing level of the "soft rubber" coating.

TABLE 1

| Filler | Coating |
| --- | --- |
| 1 | None |
| 2 | 0.015 vol. frac. fluorinated silane |
| 3 | 0.015 vol. frac. phenyltrimethoxy silane |
| 4 | 0.020 vol. frac. PDMS rubber |
| 5 | 0.071 vol. frac. PDMS rubber |
| 6 | 0.103 vol. frac. PDMS rubber |
| 7 | 0.166 vol. frac. PDMS rubber |

The examples listed in Table 2 were prepared such that the volume fraction of the filler plus coating was 0.4 or 0.5. The resin content of the resulting composites was 0.6 or 0.5 respectively. Tensile testing yielded the below results using the ASTM "microtensile die":

TABLE 2

| Filler Type | Vol. Fraction Filler | Ultimate Elongation |
| --- | --- | --- |
| None | None | 657% |
| 1 | 0.4 | 3% |
| 1 | 0.5 | 1% |
| 2 | 0.4 | 3% |
| 2 | 0.5 | 2% |
| 5 | 0.4 | 212% |
| 5 | 0.5 | 19% |
| 6 | 0.4 | 131% |
| 6 | 0.5 | 73% |
| 7 | 0.4 | 203% |
| 7 | 0.5 | 111% |

Example II Filled Fluoropolymer

The below examples demonstrate the increase in ultimate elongation of a fluoropolymer when filled with rubber coated ceramic filler in contrast with the very low elongation observed when the filler has been coated with conventional silane treatments.

The fluoropolymer used for these examples is Halar ® 5004, a commercial product of the Flouropolymer Division of Ausimont. Halar is a copolymer of ethylene and chlorotrifluoroethylene.

The fluoropolymer composite samples were prepared in the Brabender using the same method described above. Due to the higher melting point of the fluoropolymer resin, the Brabender oil temperature was set to 260° C. and the initial temperature of the mixing head was 239° C. to 242° C. The mixed composite material was pressed in a heated hydraulic press at 550° F. and microtensile specimens were cut and tested.

The sample composites in Table 3 were prepared such that the volume fraction of the fused amorphous silica itself was always 0.5. In these cases, the resin content of the resulting composite decreases as the volume fraction of coating on the filler increases. Five weight per cent CaO (total furnish weight basis) was added to the below formulations to prevent degradation.

TABLE 3

| Ultimate Elongation of Filled Flouropolymer | | |
| --- | --- | --- |
| Filler Type | Vol. Frac. Silica | Ultimate Elongation |
| None | None | 234.0% |
| 3 | 0.50 | 0.7% |
| 4 | 0.50 | 1.6% |
| 5 | 0.50 | 17.2% |

TABLE 3-continued

| Ultimate Elongation of Filled Flouropolymer | | |
| --- | --- | --- |
| Filler Type | Vol. Frac. Silica | Ultimate Elongation |
| 6 | 0.50 | 33.8% |
| 7 | 0.50 | 31.6% |

Example III Metal Oxide "Acid Scavenger"

Siliceous fillers and fibers are known to cause degradation in many fluoropolymer systems during processing.

The following samples were prepared by the same method as those listed in Example II. In these examples, the specific gravity of the pressed sheet was measured and the sheet was inspected for color (dark color indicative of degradation) and porosity (pores caused by volatile material evolved during degradation). Low specific gravity is also indicative of porosity. Unfilled Halar resin subjected to the same thermal history with filler was always light in color and free of porosity. All of the below examples contained 0.50 volume fraction silica. The metal oxide column of Table 4 lists the weight % metal oxide added to the composite.

TABLE 4

| Effect of Metal Oxides on Filled Fluoropolymer | | | |
| --- | --- | --- | --- |
| Filler | Metal Oxide | Sp.G | Appearance |
| 3 | None | 1.92 | Dark - porous |
| 3 | 3% ZnO | 1.98 | Light - no porosity |
| 3 | 5.1% Sb$_2$O$_3$ | 1.98 | Light - no porosity |
| 5 | None | 1.85 | Dark - porous |
| 5 | 5% CaO | 1.95 | Light - no porosity |
| 5 | 4.3% ZnO | 1.95 | Light - no porosity |
| 5 | 5.1% Sb$_2$O$_3$ | 1.93 | Light - no porosity |

Example IV—Compliancy

U.S. application Ser. No. 279,474 filed Dec. 2, 1988 describes an ultra compliant version of the highly filled fluoropolymeric composite disclosed in U.S. Pat. No. 4,849,284. U.S. Ser. No. 279,474 achieved this ultracompliancy by using a fluorosilane coating on the ceramic particulate filler. It has now been discovered that the application of a reactive silicone coating to the ceramic filler in a fluoropolymer composite will yield a final composite having greater compliancy than even the fluorosilane coated fillers of U.S. Ser. No. 279,474. This surprising and unexpected result is set forth in Table 5 where identical composites of PTFE (40% by volume), silica filler (60% by volume) were compared; with the only differences residing in the filler coatings (e.g., no coating, fluorosilane coating and silicone coating). Coating levels were comparable for both the C$_6$F and the silicone coatings. Table 5 also shows that the silicone coating significantly reduces water absorption.

TABLE 5

| Filler Coating | Tensile Modulus (Kpsi) | Elongation % | Tensile Strength (Kpsi) | Water Absorption (48 Hrs.) |
| --- | --- | --- | --- | --- |
| No | 29 | 12 | 0.4 | 3.2% |
| C$_6$F | 27 | 186 | 1.0 | 0.02% |
| Silicone | 9 | 236 | 0.9 | 0.05% |

The thermoplastic composite of the present invention provides many features and advantages over prior art bond-ply materials such as RO-2810 disclosed in U.S. Pat. No. 4,849,284. For example, use of the present invention permits a lower press temperature (less than 500° F.) to bond inner layers during the lamination of multilayer printed wiring boards. This will allow circuit processing facilities that do not possess high temperature bonding equipment to construct multilayer printed wiring boards of RO-2800 (and like materials) without capital expenditure. A further advantage of the present invention is its improved rheology and lower viscosity. The present invention will flow at lamination temperatures and fill features in a manner similar to FR4 epoxy glass materials.

The advantages of the present invention over the use of FR4 epoxy/glass laminate to bond inner layers of RO-2800 (and like materials) are the lower DK and loss and better adhesion to non-treated fluoropolymer surfaces of the present invention. The particulate nature of the filler system of the present invention also yields a material that will drill better.

The advantages of the present invention over "exotic" laminate materials such as Quatrex/quartz and cyanate ester prepregs are, in some of the cases, the better adhesion of the present invention to fluoropolymer surfaces. There again will be the drilling advantage of the particulate filled material over fiber reinforced material.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A thermoplastic composite material, comprising:
   extrudable thermoplastic matrix material,
   ceramic filler material, said filler material being in an amount of at least about 40 volume percent of the total composite; and
   an elastomeric polymer coated over said ceramic filler, said elastomeric polymer being bonded to said ceramic filler and comprising from about 2 weight percent to about 10 weight percent of the total ceramic filler.

2. The composite of claim 1 wherein:
   said thermoplastic matrix material comprises a chlorofluoropolymeric or fluoropolymeric material.

3. The composite of claim 2 wherein said chlorofluoropolymeric material is selected from the group comprising:
   poly(ethylene-co-chlorotrifluoroethylene, chlorotrifluoroethylene.

4. The composite of claim 3 wherein said ceramic filler comprises silica.

5. The composite of claim 4 wherein said silica comprises amorphous fused silica powder.

6. The composite of claim 1 wherein said elastomeric polymer comprises silicone rubber which forms chemical bonds to said ceramic filler material.

7. The composite of claim 2 including at least one acid scavenger.

8. The composite of claim 7 wherein said acid scavenger comprises a metal oxide.

9. The composite of claim 8 wherein:
   said metal oxide is selected from group consisting of CaO, ZnO, MgO, or $Sb_2O_3$.

10. The composite of claim 1 wherein:
    said thermoplastic matrix material is selected from the group consisting of poly (4-methylpentene) and polyolefins.

11. The composite of claim 1 wherein said thermoplastic matrix material and said ceramic filler material define a substrate and including:
    conductive material on at least a portion of said substrate.

12. In a multilayer circuit including at least a first circuit layer and second circuit layer, the improvement comprising:
    an adhesive layer sandwiched between the first and second circuit layers, said adhesive layer comprising:
    extrudable thermoplastic matrix material;
    ceramic filler material, said filler material being in an amount of at least about 40 volume percent of the total composite; and
    an elastomeric polymer coated over said ceramic filler, said elastomeric polymer being bonded to said ceramic filler, but not bonded to said thermoplastic matrix and said elastomeric polymer comprising from about 2 weight percent to about 10 weight percent of the total ceramic filler.

13. The multilayer circuit of claim 12 including:
    at least one plated through hole.

14. The multilayer circuit of claim 12 wherein:
    said thermoplastic matrix material comprises a chlorofluoropolymeric or fluoropolymeric material.

15. The multilayer circuit of claim 14 wherein said chlorofluoropolymeric material is selected from the group comprising;
    poly(ethylene-co-chlorotrifluoroethylene, or chlorotrifluoroethylene.

16. The multilayer circuit of claim 15 wherein said ceramic filler comprises silica.

17. The multilayer circuit of claim 16 wherein said silica comprises amorphous fused silica powder.

18. The multilayer circuit of claim 12 wherein said elastomeric polymer comprises silicone rubber which forms chemical bonds to said ceramic filler material.

19. The multilayer circuit of claim 14 including at least one acid scavenger.

20. The multilayer circuit of claim 19 wherein said acid scavenger comprises a metal oxide.

21. The multilayer circuit of claim 20 wherein:
    said metal oxide is selected from group consisting of CaO, ZnO, MgO, or $Sb_2O_3$.

22. The composite of claim 12 wherein:
    said thermoplastic matrix material is selected from the group consisting of poly (4-methylpentene) and polyolefins.

23. The multilayer circuit of claim 12 wherein:
    said first and second circuit layers comprise a ceramic filled fluoropolymeric substrate wherein said ceramic filler is coated with a silane coating material.

24. A highly filled thermoplastic matrix composite material, comprising:
    a matrix, said matrix comprising an extrudable thermoplastic polymer;
    a ceramic filler distributed throughout said matrix in an amount of at least about 40 volume percent of the composite material; and
    an elastomeric polymer coated over and bonded to the ceramic filler, said elastomeric polymer being included in an amount effective to increase the ultimate tensile elongation of the composite material to render the composite material handleable in sheet form.

25. The composite material of claim 24, wherein the elastomeric polymer is included in an amount of about 2 volume percent to about 20 volume percent of the amount of ceramic filler.

26. A multilayer circuit, comprising:
   a first circuit layer;
   a second circuit layer; and
   a layer of adhesive sandwiched between the first and second circuit layers, said adhesive layer comprising:
      a matrix, said matrix comprising an extrudable thermoplastic polymer;
      a ceramic filler distributed throughout said matrix in an amount of at least about 40 volume percent of the composite material; and
      an elastomeric polymer coated over and bonded to the ceramic filler, said elastomeric polymer being included in an amount effective to increase the ultimate tensile elongation of the composite material to render the composite material handleable in sheet form.

27. The multilayer circuit of claim 26, wherein the elastomeric polymer is included in an amount of about 2 volume percent to about 20 volume percent of the amount of ceramic filler.

* * * * *

UNITED STATES PATENT AND TRADEMARK OFFICE
CERTIFICATE OF CORRECTION

PATENT NO. : 5,077,115

DATED : Dec. 31, 1991

INVENTOR(S) : Arthur et al.

It is certified that error appears in the above-identified patent and that said Letters Patent is hereby corrected as shown below:

Col. 3, line 30, Delete "handlable" and insert therefore -- handleable --.

Col. 4, line 29 Insert --) -- between "aluminum" and "thereon".

Col. 7, lines 47-48 Delete "is selected from the group comprising:" and insert therefore -- comprises:--.

Col. 7, lines 49-50 insert --). -- after "ethylene-co-chlorotrifluoroethylene -- and delete ", chlorotrifluoroethylene.".

Col. 8, lines 28-29 Delete "is selected from the group comprising;" and insert therefore -- comprises:--.

Col. 8, lines 30-31 Insert --). -- after "ethylene-co-chlorotrifluoroethylene -- and delete ", or chlorotrifluoroethylene.".

Signed and Sealed this

Eleventh Day of May, 1993

Attest:

MICHAEL K. KIRK

*Attesting Officer*   *Acting Commissioner of Patents and Trademarks*